(12) United States Patent
Fujikawa et al.

(10) Patent No.: US 8,643,065 B2
(45) Date of Patent: Feb. 4, 2014

(54) SEMICONDUCTOR DEVICE AND METHOD FOR MANUFACTURING THE SAME

(75) Inventors: Kazuhiro Fujikawa, Osaka (JP); Hideto Tamaso, Osaka (JP); Shin Harada, Osaka (JP); Yasuo Namikawa, Osaka (JP)

(73) Assignee: Sumitomo Electric Industries, Ltd., Osaka-shi (JP)

(*) Notice: Subject to any disclaimer, the term of this patent is extended or adjusted under 35 U.S.C. 154(b) by 163 days.

(21) Appl. No.: 12/919,992

(22) PCT Filed: Dec. 11, 2009

(86) PCT No.: PCT/JP2009/070737
§ 371 (c)(1),
(2), (4) Date: Aug. 27, 2010

(87) PCT Pub. No.: WO2010/071084
PCT Pub. Date: Jun. 24, 2010

(65) Prior Publication Data
US 2011/0001144 A1    Jan. 6, 2011

(30) Foreign Application Priority Data

Dec. 16, 2008  (JP) .................................. 2008-319758
Oct. 23, 2009  (JP) .................................. 2009-244596

(51) Int. Cl.
*H01L 29/80*    (2006.01)

(52) U.S. Cl.
USPC ................... 257/256; 257/272; 257/E29.314

(58) Field of Classification Search
USPC ............... 257/134, 256, 272, 273, 287, 504, 257/E29.314
See application file for complete search history.

(56) References Cited

U.S. PATENT DOCUMENTS

2003/0089930 A1*  5/2003  Zhao .............................. 257/256
2007/0292999 A1* 12/2007  Henning et al. .............. 438/167

FOREIGN PATENT DOCUMENTS

| EP | 2058848 A1 | 5/2009 |
|---|---|---|
| JP | 52-030179 A | 3/1977 |
| JP | 53-132274 A | 11/1978 |
| JP | 55-004912 A | 1/1980 |
| JP | 59-167069 A | 9/1984 |
| JP | 11-307784 A | 11/1999 |
| JP | 2003-068762 A | 3/2003 |
| JP | 2003-197641 A | 7/2003 |
| JP | 2006-332180 A | 12/2006 |
| JP | 2008-147576 A | 6/2008 |
| JP | 2008-153445 | 7/2008 |
| WO | WO-2008/075488 A1 | 6/2008 |

\* cited by examiner

*Primary Examiner* — Benjamin Sandvik
*Assistant Examiner* — Leslie Pilar Cruz
(74) *Attorney, Agent, or Firm* — Venable LLP; Michael A. Sartori; Steven J. Schwarz

(57) ABSTRACT

A JFET is a semiconductor device allowing more reliable implementation of the characteristics essentially achievable by employing SiC as a material and includes a wafer having at least an upper surface made of silicon carbide, and a gate contact electrode formed on the upper surface. The wafer includes a first p-type region serving as an ion implantation region formed so as to include the upper surface. The first p-type region includes a base region disposed so as to include the upper surface, and a protruding region. The base region has a width ($w_1$) in the direction along the upper surface greater than a width ($w_2$) of the protruding region. The gate contact electrode is disposed in contact with the first p-type region such that the gate contact electrode is entirely located on the first p-type region as seen in plan view.

5 Claims, 8 Drawing Sheets

SEMICONDUCTOR DEVICE AND METHOD FOR MANUFACTURING THE SAME

TECHNICAL FIELD

The present invention relates to a semiconductor device and a method for manufacturing the semiconductor device, and more particularly to a semiconductor device including a wafer having at least one main surface made of silicon carbide and a method for manufacturing the semiconductor device.

BACKGROUND ART

In recent years, silicon carbide (SiC) has been increasingly employed as a material for forming a semiconductor device such as a transistor and a diode in order to allow an increase in the breakdown voltage and a decrease in loss, and also allow use in a high temperature environment, and the like. Silicon carbide serves as a wide band gap semiconductor having a band gap greater than that of silicon (Si) which has been conventionally widely used as a material forming a semiconductor device. Accordingly, when silicon carbide is employed as a material for forming a semiconductor device, an increase in the breakdown voltage, a decrease in the on-resistance and the like in the semiconductor device can be achieved. Furthermore, the semiconductor device formed using silicon carbide as a material also has an advantage that the deterioration of the characteristics obtained when used in a high temperature environment is relatively small as compared to a semiconductor device formed using silicon as a material.

Several semiconductor devices have been proposed in a variety of structures, to which SiC having the above-described excellent characteristics can be applied as a material (for example, see Japanese Patent Laying-Open No. 2003-068762 (Patent Document 1)). Furthermore, in the process of manufacturing a semiconductor device formed using SiC as a material, impurities are often introduced into a wafer made of SiC by ion implantation. Thus, various methods for satisfactorily performing ion implantation have also been proposed (for example, see Japanese Patent Laying-Open No. 2006-332180 (Patent Document 2) and Japanese Patent Laying-Open No. 2008-147576 (Patent Document 3)).

PRIOR ART DOCUMENTS

Patent Documents

Patent Document 1: Japanese Patent Laying-Open No. 2003-068762
Patent Document 2: Japanese Patent Laying-Open No. 2006-332180
Patent Document 3: Japanese Patent Laying-Open No. 2008-147576

SUMMARY OF THE INVENTION

Problems to be Solved by the Invention

However, the semiconductor device such as a transistor formed using SiC as a material also causes a problem that characteristics such as a breakdown voltage which should be essentially achieved may not be achieved. Thus, an object of the present invention is to provide a semiconductor device which allows more reliable implementation of the characteristics essentially achievable by employing SiC as a material, and a method for manufacturing the semiconductor device.

Means for Solving the Problems

A semiconductor device according to the present invention includes a wafer having at least one main surface made of silicon carbide; and an electrode formed on the one main surface. The wafer includes an ion implantation region formed to include the one main surface. Furthermore, the ion implantation region includes a base region disposed to include the one main surface and a protruding region connected to the base region and extending in a direction opposite to the electrode. Furthermore, the base region is greater in width in a direction along the one main surface than the protruding region. The electrode is disposed in contact with the ion implantation region such that the electrode is entirely located on the ion implantation region as seen in plan view.

The inventors of the present invention made a detailed study of the cause that the characteristics such as a breakdown voltage as described above which should be essentially achieved might not be achieved in the semiconductor device such as a transistor formed using SiC as a material. Consequently, the following findings were obtained to achieve the present invention.

In general, the process of manufacturing a semiconductor device formed using SiC as a material is often carried out in such a manner that an ion implantation region is formed on an SiC wafer, and then, a metal electrode made of metal such as nickel (Ni) is formed so as to be brought into contact with the ion implantation region. In the manufacturing process as described above, the alloying reaction between the metal forming a metal electrode and SiC forming a wafer proceeds to cause diffusion of the metal into the wafer. When this diffusion causes the metal to extend to the outside of the ion implantation region, the characteristics such as a breakdown voltage of the semiconductor device to be manufactured are deteriorated, which causes a problem that the essentially achievable characteristics cannot be achieved. The above-described problem is generally caused by diffusion of the metal in the direction perpendicular to the direction in which ions are implanted.

In this case, the above-described problem can be solved by sufficiently decreasing the size of the planar shape of the metal electrode with respect to the planar shape of the ion implantation region. For the purpose of this, as compared to the conventional case, the metal electrode should be decreased in size or the planar shape of the ion implantation region should be increased in size. However, the structure of the semiconductor device has been increasingly reduced in size in recent years, which makes it difficult to configure the metal electrode to have a planar shape less in size than in the past. Furthermore, in consideration of the development of size reduction of the structure of the semiconductor device, it is also difficult to configure the ion implantation region to have a planar shape greater in size than in the past.

In contrast, in the semiconductor device according to the present invention, the ion implantation region formed so as to be brought into contact with the electrode includes a base region disposed so as to be brought into contact with the electrode and a protruding region extending from the base region in the direction opposite to the electrode. The base region is greater in width than the protruding region. Accordingly, in the base region that should be brought into contact with the electrode, the base region is ensured to have a width sufficient to allow diffusion of the metal from the electrode to fall within the ion implantation region, to thereby suppress deterioration of the characteristics in the semiconductor device. On the other hand, in the protruding region spaced apart from the electrode to reduce possibility that diffusion of the metal from the electrode extends to the protruding region, the protruding region reduced in width can be adapted to reduction in size of the structure of the semiconductor device. As described above, according to the semiconductor device of the present invention, a semiconductor device can be provided which is capable of more reliably achieving the characteristics essentially achievable by employing SiC as a material.

In order to ensure that diffusion of the metal from the electrode falls within the ion implantation region, it is preferable that the electrode is disposed in contact with the ion implantation region such that the electrode is entirely located above the protruding region as seen in plan view.

The above-described semiconductor device may be a junction field effect transistor (JFET), and the above-described electrode may be a gate electrode.

Accordingly, the gate length is reduced so as not to inhibit reduction in size of the JFET while suppressing a decrease in the breakdown voltage caused by diffusion of the metal forming a gate electrode, with the result that a high breakdown voltage can be ensured. Furthermore, in this JFET, the width of the protruding region in the direction along the above-described one main surface of the wafer corresponds to a channel length. Accordingly, the base region is configured to have a width in the direction along the above-described one main surface which allows formation of a gate electrode, and the protruding region is configured to have a width narrower than this width, with the result that the channel length can be reduced. Consequently, a JFET can be provided which has an on-resistance lower than that in the conventional case and allows high-speed switching.

In the above-described semiconductor device, the wafer may include a first layer of a first conductivity type; a layer of a second conductivity type which is different in conductivity type from the first layer of the first conductivity type, and disposed on and in contact with the first layer of the first conductivity type; and a second layer of the first conductivity type which is identical in conductivity type to the first layer of the first conductivity type, and disposed on and in contact with the layer of the second conductivity type.

When this configuration is applied to the above-described semiconductor device corresponding to a JFET, in the state where the JFET is turned off, a depletion layer extends in the direction of the thickness of the wafer to render the electric field distribution uniform within a drift region, which results in relaxation of the electric field concentration in the vicinity of the gate electrode. Consequently, a breakdown occurring due to the electric field concentration may be suppressed.

Preferably, in the above-described semiconductor device, a thickness of the base region in a direction of a thickness of the wafer is less than or equal to a distance from the one main surface to an interface between the second layer of the first conductivity type and the layer of the second conductivity type.

Accordingly, the electric field concentration can be relaxed in the vicinity of the outer periphery of the tip located on the side opposite to the electrode of the base region. Consequently, a decrease in the breakdown voltage in the semiconductor device can be suppressed with more reliability.

Preferably, in the above-described semiconductor device, the base region is greater in width in the direction along the one main surface than the protruding region by 0.2 μm or more and 1.0 μm or less.

In general, the electrode made of metal such as Ni formed so as to be brought into contact with the ion implantation region has a thickness of approximately 500 to 1000 Å. In this case, the distance of metal diffusion caused by the alloying reaction with SiC is approximately 0.1 μm. Accordingly, in consideration of the margin for the distance of metal diffusion as described above, it is preferable that the base region is greater in width than the protruding region by 0.2 μm or more. The base region having a width greater than that of the protruding region by over 1.0 μm may interfere with the reduction in size of the structure of the semiconductor device. Accordingly, it is preferable that the base region is adjusted to have a width greater than that of the protruding region by 0.2 μm or more and 1.0 μm or less. Furthermore, when reduction in size of the structure of the semiconductor device is of great importance, it is preferable that the base region is adjusted to have a width greater than that of the protruding region by 0.2 μm or more and 0.6 μm or less.

Preferably, in the above-described semiconductor device, the base region has a thickness of 0.3 μm or more.

The results of the experiment carried out by the inventors of the present invention show that the base region having a thickness of less than 0.3 μm may cause the metal to diffuse to the outside of the base region in the direction of the thickness of the base region. Accordingly, it is preferable that the base region has a thickness of 0.3 μm or more. It is to be noted that the base region having a thickness exceeding 0.4 μm may interfere with the reduction in size of the structure of the semiconductor device. Accordingly, it is preferable that the base region has a thickness of 0.4 μm or less.

The method for manufacturing a semiconductor device according to the present invention includes the steps of preparing a wafer; forming a blocking layer; providing an opening in the blocking layer; forming a first region in the wafer; enlarging the opening; forming a second region in the wafer; and forming a metal film.

The step of preparing a wafer includes the step of preparing a wafer having at least one main surface made of silicon carbide. The step of forming a blocking layer includes the step of forming a blocking layer on the one main surface for blocking ion implantation into the wafer. The step of forming a first region in the wafer includes the step of implanting ions of a first conductivity type using, as a mask, the blocking layer having an opening provided therein, to form, in the wafer, a first region having the ions of the first conductivity type implanted thereinto. The step of enlarging the opening includes the step of enlarging the opening of the blocking layer used for forming the first region. The step of forming a second region in the wafer includes the step of implanting the ions of the first conductivity type using, as a mask, the blocking layer having the enlarged opening at a depth shallower than a depth of implantation in the step of forming the first region in the wafer, to form, in the wafer, a second region having the ions of the first conductivity type implanted thereinto. The step of forming a metal film includes the step of forming a metal film on the wafer such that the metal film is entirely located on the second region as seen in plan view.

In the method for manufacturing a semiconductor device according to the present invention, an opening is provided in a blocking layer in accordance with the desired shape of a first region, and the blocking layer is used as a mask to perform ion implantation to form a first region. Then, the opening of the blocking layer is enlarged to perform ion implantation again to form a second region. Therefore, according to the method for manufacturing a semiconductor device of the present invention, a semiconductor device of the present invention as described above can readily be manufactured which includes an ion implantation region having a base region and a protruding region. In addition, in order to allow metal diffusion from the metal film to fall within the ion implantation region with more reliability, it is preferable that the step of forming a metal film on the wafer includes the step of forming a metal film so as to be entirely located on the first region as seen in plan view.

Preferably, in the above-described method for manufacturing a semiconductor device, the step of forming a blocking layer includes the step of forming the blocking layer including a titanium layer and a tungsten layer disposed on the titanium layer; the blocking layer including a titanium layer and a silicon dioxide layer disposed on the titanium layer; or the blocking layer including a silicon dioxide layer, a titanium layer disposed on the silicon dioxide layer and a tungsten layer disposed on the titanium layer.

The layer forming a blocking layer may include a tungsten (W) layer and a silicon dioxide ($SiO_2$) layer having an excellent ability of blocking ion implantation into the wafer. In the step of providing an opening in the blocking layer, the opening may often be provided in the blocking layer by etching such as dry etching. In this case, when the blocking layer made only of a W layer or an $SiO_2$ layer is employed, the etching has an effect not only on the blocking layer but also on the wafer, which may cause damage to the wafer. In contrast, when a titanium (Ti) layer which is resistant to etching in the case of the etching to the W layer or the $SiO_2$ layer is formed as an etching stop layer between the wafer and the W layer or the $SiO_2$ layer, damage to the wafer can be suppressed. In addition, as the Ti layer is reduced in thickness, for example, to approximately 100 nm, ion implantation can be carried out even in the state where the Ti layer still remains. Furthermore, an $SiO_2$ layer may be further formed as a sacrificial layer between the Ti layer and the wafer in order to facilitate the process of removing the Ti layer formed as an etching stop layer from the wafer after completion of the ion implantation. Furthermore, the Ti layer can be removed selectively with respect to the $SiO_2$ layer by using a mixed solution of ammonia water and oxygenated water, and the like.

In other words, a W layer or an $SiO_2$ layer having an excellent ability of blocking ion implantation can be employed as a layer for forming a blocking layer. In this case, it is preferable to form a Ti layer as an etching stop layer between the wafer and the W layer or the $SiO_2$ layer. Furthermore, when the Ti layer is formed as an etching stop layer, it is more preferable to form an $SiO_2$ layer as a sacrificial layer between the Ti layer and the wafer for the purpose of facilitating removal of the Ti layer.

Preferably, in the above-described method for manufacturing a semiconductor device, the step of enlarging the opening includes the step of enlarging the opening such that a peripheral edge of the opening is increased in circumference by 0.1 μm or more and 0.5 μm or less as seen in plan view.

As described above, the distance of diffusion of the metal forming a metal film (electrode) caused by the alloying reaction is approximately 0.1 μm. Accordingly, when the opening is enlarged such that the peripheral edge of the opening is increased in circumference by 0.1 μm or more, the second region can be formed such that the margin for the distance of metal diffusion is ensured. In addition, the base region having a width greater than that of the protruding region by over 1.0 μm may interfere with the reduction in size of the structure of the semiconductor device. Thus, it is preferable to enlarge the opening such that the peripheral edge of the opening is increased in circumference by 0.5 μm or less. Furthermore, when reduction in size of the structure of the semiconductor device is of great importance, it is preferable to enlarge the opening such that the peripheral edge of the opening is increased in circumference by 0.3 μm or less.

Preferably, in the above-described method for manufacturing a semiconductor device, the step of forming a second region in the wafer includes the step of forming a second region having a thickness of 0.3 μm or more.

As described above, it is preferable that the base region forming an ion implantation region has a thickness of 0.3 μm or more. Accordingly, it is preferable that the step of forming a second region in the wafer includes the step of forming a second region having a thickness of 0.3 μm or more. In contrast, as described above, the base region having a thickness exceeding 0.4 μm may interfere with the reduction in size of the structure of the semiconductor device. Therefore, it is preferable that the step of forming a second region in the wafer includes the step of forming a second region having a thickness of 0.4 μm or less.

In the above-described method for manufacturing a semiconductor device, the semiconductor device may be a junction field effect transistor, and the metal film may be a gate electrode. Consequently, a JFET can readily be manufactured which has a reduced gate length so as not to inhibit size reduction while suppressing a decrease in the breakdown voltage caused by diffusion of the metal forming a gate electrode, to thereby allow a high breakdown voltage to be ensured.

Effects of the Invention

As is obvious from the above-described explanation, according to the semiconductor device of the present invention and the method for manufacturing the same, it becomes possible to provide a semiconductor device capable of more reliably achieving the characteristics essentially achievable by employing SiC as a material, and a method for manufacturing the semiconductor device.

MODES FOR CARRYING OUT THE INVENTION

Figure 1:
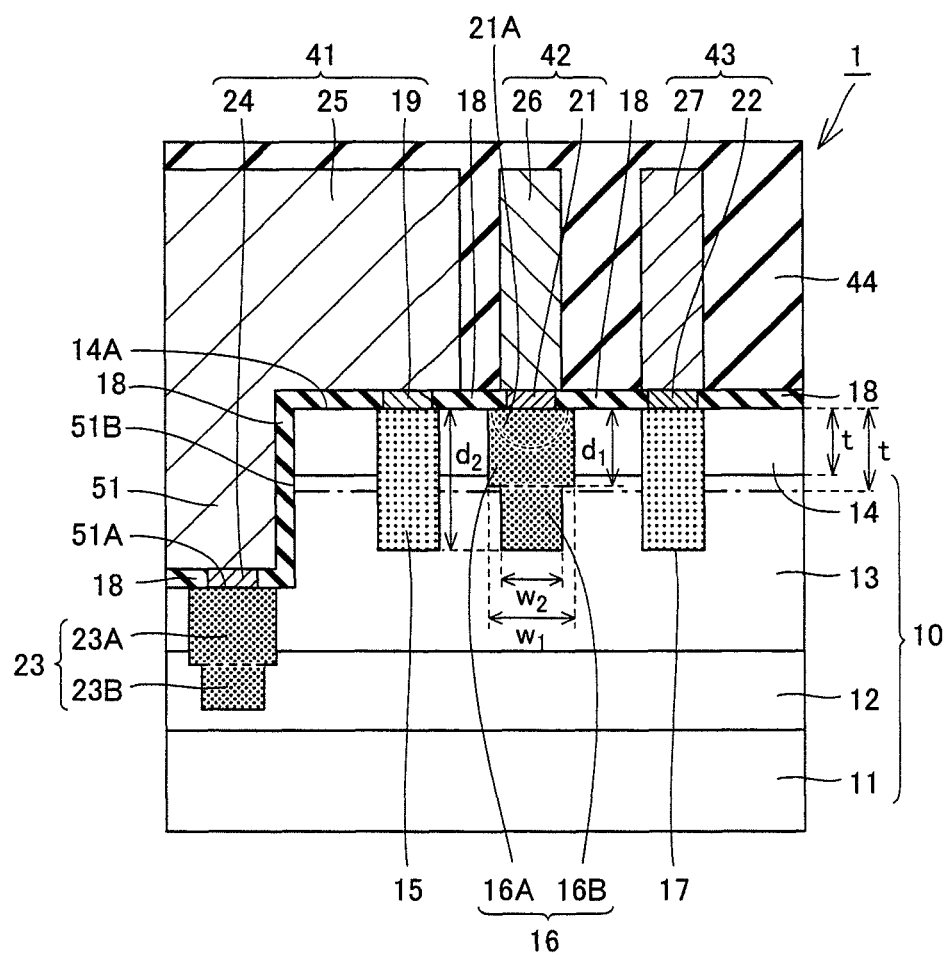
FIG. 1 is a schematic cross sectional view showing the configuration of a JFET in the first embodiment of the present invention.

The embodiments of the present invention will be hereinafter described with reference to the accompanying drawings, in which the same or corresponding components are designated by the same reference characters, and description thereof will not be repeated.

Referring to FIG. 1, a JFET 1 according to the present embodiment includes an n-type substrate 11 made of SiC having n-type conductivity, a first p-type layer 12 formed on n-type substrate 11, an n-type layer 13 formed on first p-type layer 12, and a second p-type layer 14 formed on n-type layer 13. In this case, a p-type layer and an n-type layer each are made of SiC having p-type conductivity and n n-type conductivity, respectively. N-type substrate 11, first p-type layer 12, n-type layer 13, and second p-type layer 14 constitute a wafer 10 made of SiC.

Second p-type layer 14 and n-type layer 13 each have a first n-type region 15 and a second n-type region 17 formed therein which contain impurities of n-type conductivity (n-type impurities) higher in concentration than n-type layer 13 (for example, approximately $1 \times 10^{20}$ cm$^{-3}$). Furthermore, a first p-type region 16 containing impurities of p-type conductivity (p-type impurities) higher in concentration than first p-type layer 12 and second p-type layer 14 (for example, approximately $1 \times 10^{18}$ cm$^{-3}$) is formed so as to be interposed between first n-type region 15 and second n-type region 17. In other words, first n-type region 15, first p-type region 16 and second n-type region 17 each are formed so as to extend through second p-type layer 14 to n-type layer 13. Furthermore, the bottom of each of first n-type region 15, first p-type region 16 and second n-type region 17 is located spaced apart from the upper surface of first p-type layer 12 (the interface between first p-type layer 12 and n-type layer 13).

Furthermore, a groove 51 is formed on the side opposite to first p-type region 16 across first n-type region 15 so as to extend from an upper surface 14A of second p-type layer 14 (the main surface on the side opposite to n-type layer 13) through second p-type layer 14 to n-type layer 13. In other words, a bottom wall 51A of groove 51 is spaced apart from the interface between first p-type layer 12 and n-type layer 13 and located within n-type layer 13. Furthermore, a second p-type region 23 containing p-type impurities higher in concentration than first p-type layer 12 and second p-type layer 14 (for example, approximately $1 \times 10^{18}$ cm$^{-3}$) is formed so as to extend from bottom wall 51A of groove 51 through n-type layer 13 to first p-type layer 12. The bottom of second p-type region 23 is spaced apart from the upper surface of n-type substrate 11 (the interface between n-type substrate 11 and first p-type layer 12).

Furthermore, a source contact electrode 19, a gate contact electrode 21, a drain contact electrode 22, and a potential holding contact electrode 24 each serving as an ohmic contact electrode are formed so as to be brought into contact with the upper surface of each of first n-type region 15, first p-type region 16, second n-type region 17, and second p-type region 23, respectively. Source contact electrode 19, gate contact electrode 21, drain contact electrode 22, and potential holding contact electrode 24 are made, for example, of Ni (nickel).

In addition, source contact electrode 19, gate contact electrode 21, drain contact electrode 22, and potential holding contact electrode 24 each serving as an ohmic contact electrode are formed on their respective adjacent ohmic contact electrodes with an oxide film 18 interposed therebetween. More specifically, at upper surface 14A of second p-type layer 14 and at bottom wall 51A and a side wall 51B of groove 51, oxide film 18 serving as an insulation film is formed so as to cover the entire region other than those where source contact electrode 19, gate contact electrode 21, drain contact electrode 22, and potential holding contact electrode 24 are formed. Accordingly, the adjoining ohmic contact electrodes are insulated from each other.

Furthermore, source wiring 25, gate wiring 26 and drain wiring 27 are formed in contact with the upper surface of each of source contact electrode 19, gate contact electrode 21 and drain contact electrode 22, respectively, and are electrically connected to each ohmic contact electrode. Source wiring 25 is also in contact with the upper surface of potential holding contact electrode 24 and also electrically connected to potential holding contact electrode 24. In other words, source wiring 25 is formed so as to extend from the upper surface of source contact electrode 19 onto the upper surface of potential holding contact electrode 24, which causes potential holding contact electrode 24 to be held at the same potential as that of source contact electrode 19. Source wiring 25, gate wiring 26 and drain wiring 27 each are made of a conductor such as Al, for example. Source contact electrode 19 and source wiring 25 constitute a source electrode 41. Gate contact electrode 21 and gate wiring 26 constitute a gate electrode 42. Drain contact electrode 22 and drain wiring 27 constitute a drain electrode 43. Furthermore, a passivation film 44 is formed so as to cover the upper surface of each of source electrode 41, gate electrode 42, drain electrode 43, and oxide film 18. This passivation film 44 is made, for example, of SiO$_2$ and serves to electrically insulate source electrode 41, gate electrode 42 and drain electrode 43 from outside while having a function of protecting JFET 1.

First p-type region 16 and second p-type region 23 each are an ion implantation region formed by ion implantation. First p-type region 16 has a base region 16A disposed so as to include upper surface 14A of second p-type layer 14 and a protruding region 16B extending from base region 16A in the direction opposite to gate contact electrode 21. Base region 16A has a width $w_1$ in the direction along upper surface 14A of second p-type layer 14 greater than a width $w_2$ of protruding region 16B. Furthermore, as with the above-described first p-type region 16, second p-type region 23 also has a base region 23A disposed so as to include bottom wall 51A of groove 51 and a protruding region 23B extending from base region 23A in the direction opposite to potential holding contact electrode 24. Base region 23A has a width in the direction along bottom wall 51A of groove 51 greater than the width of protruding region 23B.

Thus, JFET 1 serving as a semiconductor device according to the present embodiment includes wafer 10 made of SiC, and gate contact electrode 21 formed on upper surface 14A of second p-type layer 14 corresponding to one main surface of wafer 10. Wafer 10 includes first p-type region 16 as an ion implantation region formed so as to include upper surface 14A. First p-type region 16 includes base region 16A disposed so as to include upper surface 14A, and protruding region 16B connected to base region 16A and extending in the direction opposite to gate contact electrode 21. Furthermore, base region 16A has width $w_1$ in the direction along upper surface 14A greater than width $w_2$ of protruding region 16B. Gate contact electrode 21 is disposed in contact with first p-type region 16 such that gate contact electrode 21 is entirely located on first p-type region 16 as seen in plan view.

Then, the operation of JFET 1 will be hereinafter described. Referring to FIG. 1, in the state where gate electrode 42 has a voltage greater than or equal to a threshold voltage, the region interposed between first p-type region 16 and second n-type region 17, the region interposed between the above-mentioned interposed region and first p-type layer 12 (drift region), and the region interposed between first p-type region 16 and first p-type layer 12 (channel region) are not depleted in n-type layer 13, in which first n-type region 15 and second n-type region 17 are electrically connected to each other through n-type layer 13. Accordingly, electrons moving from first n-type region 15 toward second n-type region 17 cause a current to flow.

On the other hand, when a negative voltage is applied to gate contact electrode 21, depletion in the channel region and the drift region as described above occurs, which brings about a state where first n-type region 15 and second n-type region 17 are electrically interrupted from each other. Consequently, electrons cannot move from first n-type region 15 toward second n-type region 17, which prevents a current from flowing.

In JFET 1 according to the present embodiment, first p-type region 16 formed so as to be brought into contact with gate contact electrode 21 includes base region 16A disposed so as to be brought into contact with gate contact electrode 21 and protruding region 16B extending from base region 16A in the direction opposite to gate contact electrode 21, in which base region 16A has width $w_1$ greater than width $w_2$ of protruding region 16B. Accordingly, in base region 16A in contact with gate contact electrode 21, base region 16A is ensured to have a width sufficient to allow diffusion of the metal (for example, Ni) from gate contact electrode 21 to fall within first p-type region 16 to thereby suppress a decrease in the breakdown voltage of JFET 1. In contrast, in protruding region 16B spaced apart from gate contact electrode 21 to reduce possibility that diffusion of the metal from gate contact electrode 21 extends to protruding region 16B, protruding region 16B reduced in width can be adapted to reduction in size of the structure of JFET 1.

More specifically, referring to FIG. 1, in the process of manufacturing JFET 1 formed employing SiC as a material, first p-type region 16 corresponding to an ion implantation region is formed in wafer 10 made of SiC, and then, gate contact electrode 21 made of metal such as Ni is formed so as to be in contact with first p-type region 16. In this case, the alloying reaction between the metal forming gate contact electrode 21 and SiC forming wafer 10 occurs, which leads to metal diffusion into wafer 10 to form a diffusion region 21A. In this case, when first p-type region 16 has a width of $w_2$, diffusion region 21A extends to the outside of first p-type region 16, which causes a decrease in the breakdown voltage that should be ensured by a pn junction. On the other hand, in JFET 1 according to the present embodiment, since base region 16A having a width of $w_1$ is formed, diffusion region 21A can be prevented from extending to the outside of first p-type region 16. Therefore, JFET 1 can serve to suppress a decrease in the breakdown voltage resulting from metal diffusion. In addition, as protruding region 16B sufficiently spaced apart from gate contact electrode 21 is configured to have width $w_2$ less than $w_1$, the gate length can be kept short, to thereby allow adaptation to reduction in size of the structure of JFET 1. Furthermore, in JFET 1 as described above, width $w_2$ of protruding region 16B in the direction along upper surface 14A corresponds to a channel length. Accordingly, base region 16A is configured to have width $w_1$ which allows formation of gate contact electrode 21, and protruding region 16B is configured to have width $w_2$ less than width $w_1$, with the result that the channel length can be reduced. Consequently, JFET 1 can be configured to have an on resistance lower than in the past and to allow high-speed switching.

In JFET 1 as described above, it is preferable that a thickness $d_1$ of base region 16A in the direction of the thickness of wafer 10 is less than or equal to the distance from upper surface 14A to the interface between second p-type layer 14 and n-type layer 13. In other words, it is preferable that base region 16A has thickness $d_1$ less than or equal to a thickness t of second p-type layer 14. This allows relaxation of the electric field concentration in base region 16A in the vicinity of the outer periphery of the tip located on the side opposite to gate contact electrode 21. As a result, a decrease in the breakdown voltage in JFET 1 can be suppressed with more reliability.

Furthermore, as shown in FIG. 1, first p-type region 16 has a depth $d_2$ greater than thickness t of second p-type layer 14. Furthermore, it is preferable that the difference between width $w_1$ of the base region and width $w_2$ of protruding region 16B is 0.2 μm or more and 1.0 μm or less, and more preferable, 0.2 μm or more and 0.6 μm or less.

For example, the following values can be employed for specific dimensions in JFET 1. For example, second p-type layer 14 can be configured to have thickness t of approximately 0.35 μm. Base region 16A can be configured to have thickness $d_1$ of approximately 0.30 μm, and first p-type region 16 can be configured to have depth $d_2$ of approximately 0.70 μm. Furthermore, the base region and protruding region 16B can be configured to have width $w_1$ of approximately 1.6 μm and width $w_2$ of approximately 1.0 μm, respectively.

Furthermore, first p-type layer 12 can be configured, for example, to have a thickness of approximately 10 μm and to have an impurity density of approximately $1.0 \times 10^{16}$ cm$^{-3}$. Furthermore, n-type layer 13 can be configured, for example, to have a thickness of approximately 0.65 μm and to have an impurity density of approximately $2.0 \times 10^{17}$ cm$^3$. Furthermore, second p-type layer 14 can be configured, for example, to have a thickness of approximately 0.35 μm and to have an impurity density of approximately $2.0 \times 10^{17}$ cm$^{-3}$.

Then, the method for manufacturing JFET 1 as a semiconductor device according to the present embodiment will be described.

Figure 2:
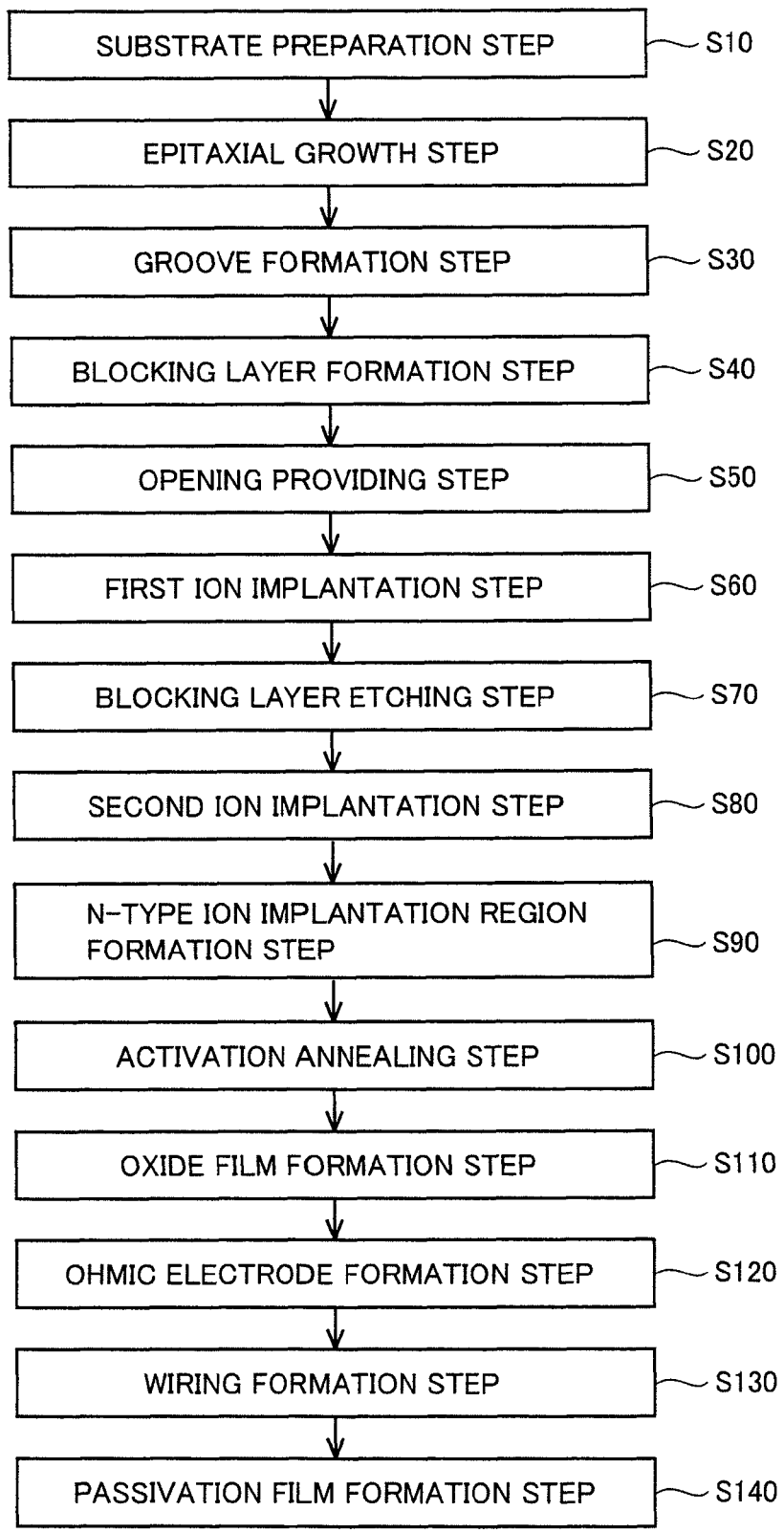
FIG. 2 is a flowchart showing the outline of a method for manufacturing the JFET.
Figure 3:
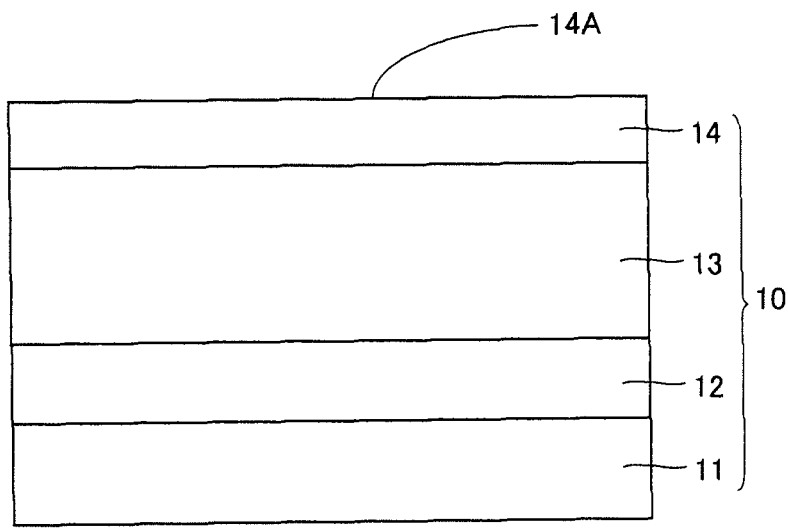
FIG. 3 is a schematic cross sectional view for illustrating the method for manufacturing the JFET.

Referring to FIG. 2, in the method for manufacturing JFET 1 according to the present embodiment, the substrate preparation step is first carried out as a step (S10). In this step (S10), as shown in FIG. 3, n-type substrate 11 made of SiC containing n-type impurities of high concentration is prepared.

Then, the epitaxial growth step is carried out as a step (S20). Specifically, referring to FIG. 3, first p-type layer 12, n-type layer 13 and second p-type layer 14 each made of SiC are sequentially formed on one main surface of n-type substrate 11, for example, by vapor phase epitaxial growth. In the vapor phase epitaxial growth, for example, silane (SiH$_4$) gas and propane (C$_3$H$_8$) gas can be used as material gas, and hydrogen (H$_2$) gas can be used as carrier gas. For example, trimethyl aluminum (TMA) can be used as a p-type impurity source for forming a p-type layer, and nitrogen (N$_2$) can be used as an n-type impurity source for forming an n-type layer. Consequently, first p-type layer 12 and second p-type layer 14 containing p-type impurities such as Al, and n-type layer 13 containing n-type impurities such as N are formed.

Figure 4:
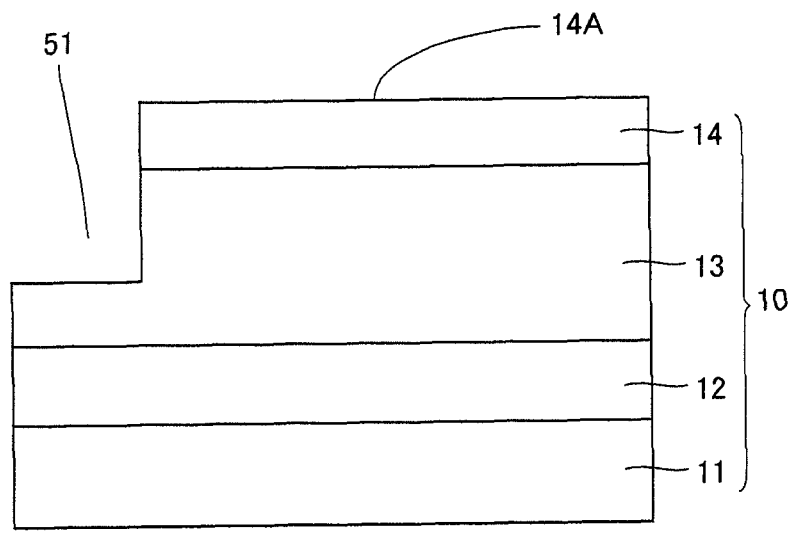
FIG. 4 is a schematic cross sectional view for illustrating the method for manufacturing the JFET.

Referring to FIG. 2, the groove formation step is then carried out as a step (S30). In this step (S30), as shown in FIG. 4, groove 51 is formed so as to extend from upper surface 14A of second p-type layer 14 through second p-type layer 14 to n-type layer 13. For example, groove 51 can be formed by forming, on upper surface 14A of second p-type layer 14, a mask layer having an opening at the desired position where groove 51 is formed, and then, performing dry etching using SF$_6$ gas.

Figure 5:
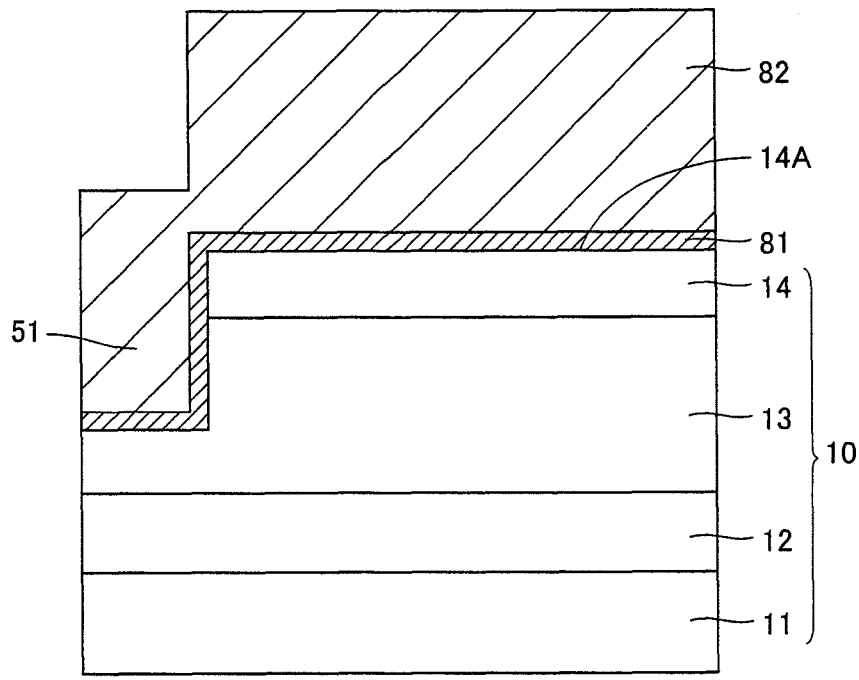
FIG. 5 is a schematic cross sectional view for illustrating the method for manufacturing the JFET.
Figure 6:
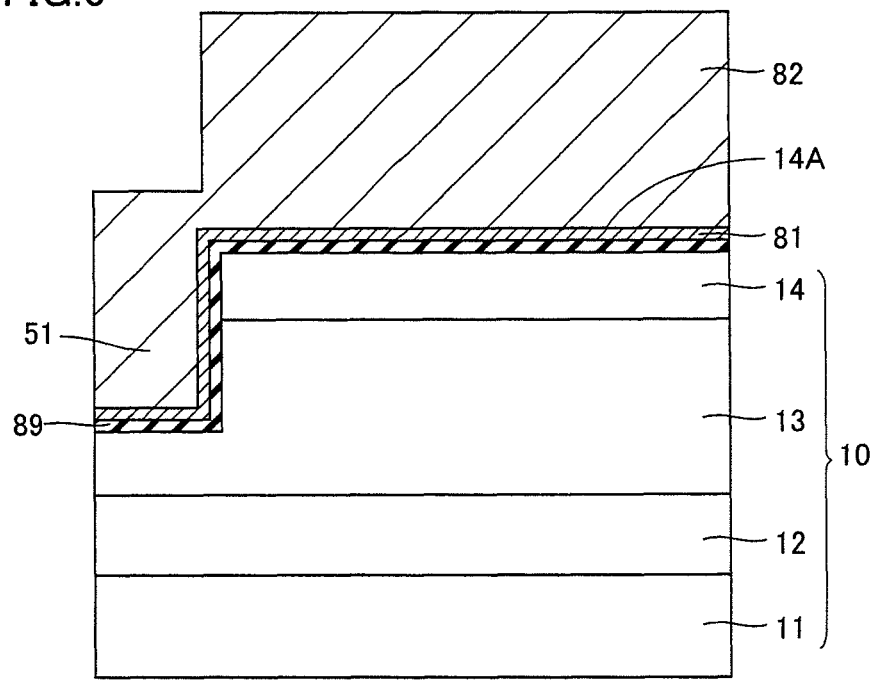
FIG. 6 is a schematic cross sectional view for illustrating the method for manufacturing the JFET.

Referring to FIG. 2, the blocking layer formation step is then carried out as a step (S40). In this step (S40), referring to FIG. 5, a Ti layer 81 made of Ti and a W layer 82 made of W are sequentially formed, for example, by sputtering so as to extend from upper surface 14A of second p-type layer 14 to the side wall and the bottom wall of groove 51. In this case, as shown in FIG. 6, an SiO$_2$ layer 89, for example, made of SiO$_2$ may be formed as a sacrificial layer between Ti layer 81 and wafer 10. Furthermore, in this step (S40), an SiO$_2$ layer may be applied in place of W layer 82.

Figure 7:
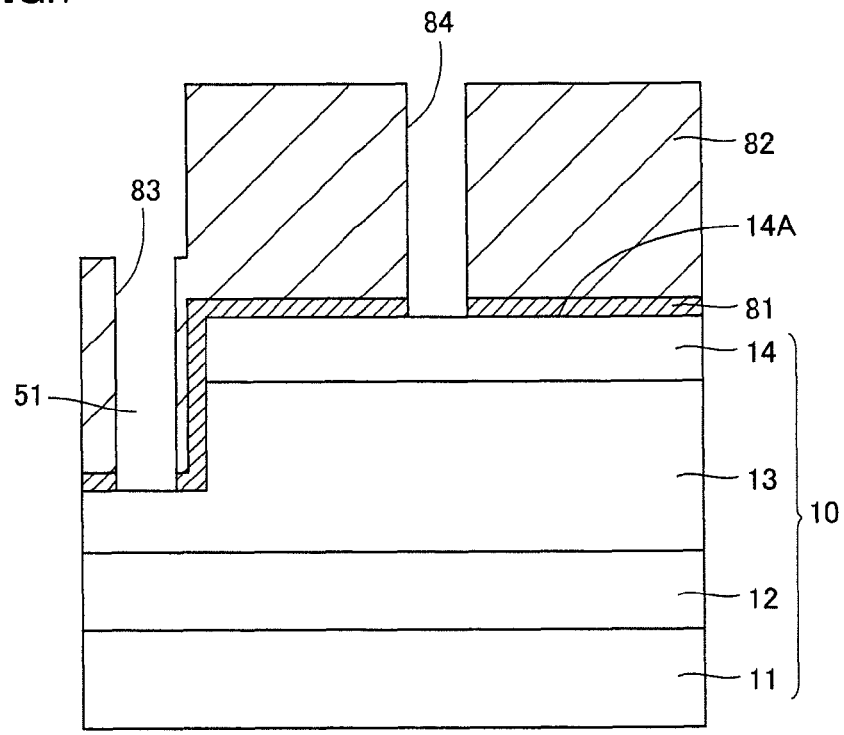
FIG. 7 is a schematic cross sectional view for illustrating the method for manufacturing the JFET.

Referring to FIG. 2, the opening providing step is carried out as a step (S50). In this step (S50), referring to FIG. 7, openings 84 and 83 are provided corresponding to the desired locations of first p-type region 16 and second p-type region 23, respectively, for the above-described Ti layer 81 and W layer 82. Openings 83 and 84 each can be provided, for example, by forming, on W layer 82, a resist layer having an opening corresponding to each desired shape of openings 83 and 84, and then performing dry etching using SF$_6$ gas. In this case, since the etching rate by SF$_6$ gas in Ti layer 81 is lower than that in W layer 82, damage to wafer 10 caused by this etching can be prevented. It is to be noted that, although FIG. 7 shows the state where openings 83 and 84 extend through Ti layer 81, ion implantation as described below can be carried out even if Ti layer 81 remains in the bottom of each of openings 83 and 84. Furthermore, the width of opening 84 defines width $w_2$ of protruding region 16B (see FIG. 1) and can be set, for example, to approximately 2 μm.

Figure 8:
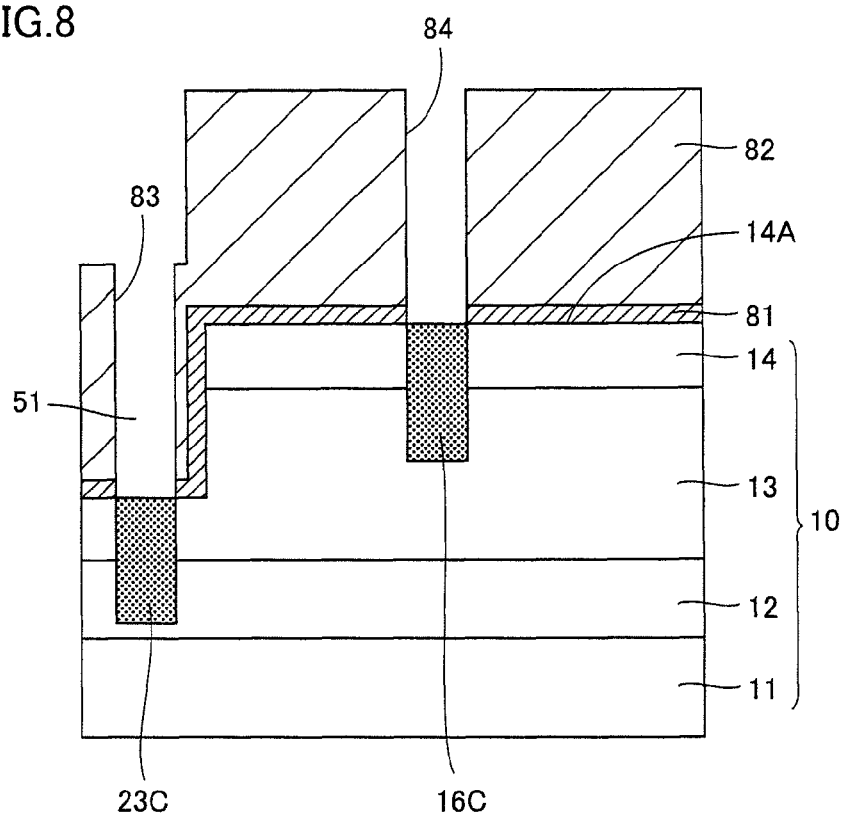
FIG. 8 is a schematic cross sectional view for illustrating the method for manufacturing the JFET.

Then, referring to FIG. 2, the first ion implantation step is carried out as a step (S60). In this step (S60), referring to FIG. 8, aluminum (Al) ions which should be, for example, p-type impurities are implanted into wafer 10 using W layer 82, as a mask, having openings 83 and 84 provided therein. Consequently, a first region 16C and a first region 23C forming first p-type region 16 and second p-type region 23, respectively, are formed. In this case, depth $d_2$ of first p-type region 16 is defined by the implantation depth of Al ions (see FIG. 1), and the implantation depth is set, for example, at approximately 0.5 μm.

Figure 9:
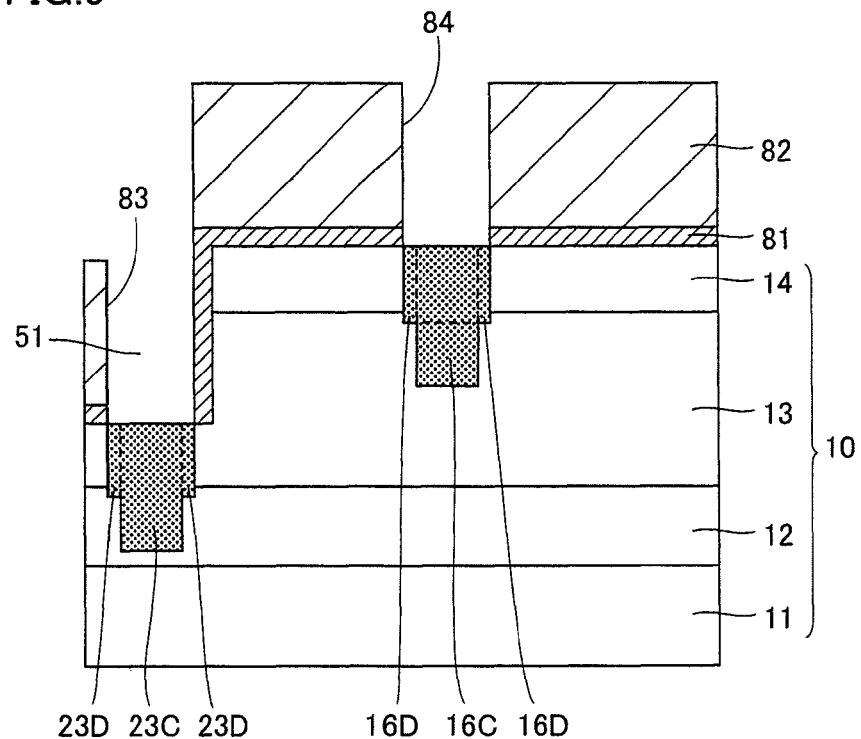
FIG. 9 is a schematic cross sectional view for illustrating the method for manufacturing the JFET.

Referring to FIG. 2, the blocking layer etching step is then carried out as a step (S70). In this step (S70), referring to FIG. 9, openings 83 and 84 are enlarged by carrying out dry etching using SF$_6$ gas without applying, for example, a resist and the like. In this case, the width of opening 84 defines width $w_1$ of base region 16A (see FIG. 1). Then, this dry etching causes side etching to occur such that the peripheral edge of opening 84 may be increased in circumference by 0.1 μm or more and 0.5 μm or less, for example, by 0.3 μm as seen in plan view.

Then, referring to FIG. 2, the second ion implantation step is carried out as a step (S80). In this step (S80), referring to FIG. 9, Al ions that should be, for example, p-type impurities are implanted into wafer 10 using W layer 82, as a mask, having openings 83 and 84 enlarged in the step (S70). Consequently, a second region 16D and a second region 23D forming first p-type region 16 and second p-type region 23, respectively, are formed. In this case, thickness $d_1$ of base region 16A is defined by the implantation depth of Al ions (see FIG. 1), and the implantation depth is set at 0.3 μm or more and 0.4 μm or less, for example, approximately at 0.3 μm.

Figure 10:
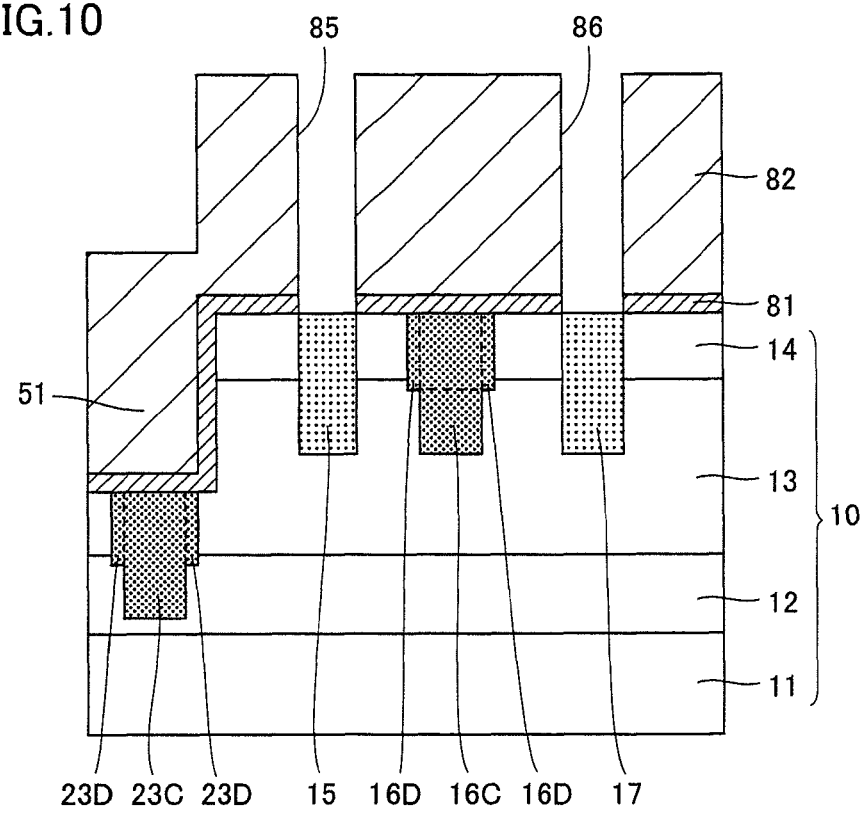
FIG. 10 is a schematic cross sectional view for illustrating the method for manufacturing the JFET.

Then, referring to FIG. 2, the n-type ion implantation region formation step is carried out as a step (S90). In this step (S90), after W layer 82 and Ti layer 81 are first removed, Ti layer 81 and W layer 82 are sequentially stacked again as in steps (S40) to (S60). Then, openings 85 and 86 corresponding to first n-type region 15 and second n-type region 17, respectively, are formed as shown in FIG. 10. Then, for example, ions such as phosphorous (P) which should be n-type impurities are implanted to form first n-type region 15 and second n-type region 17.

Figure 11:
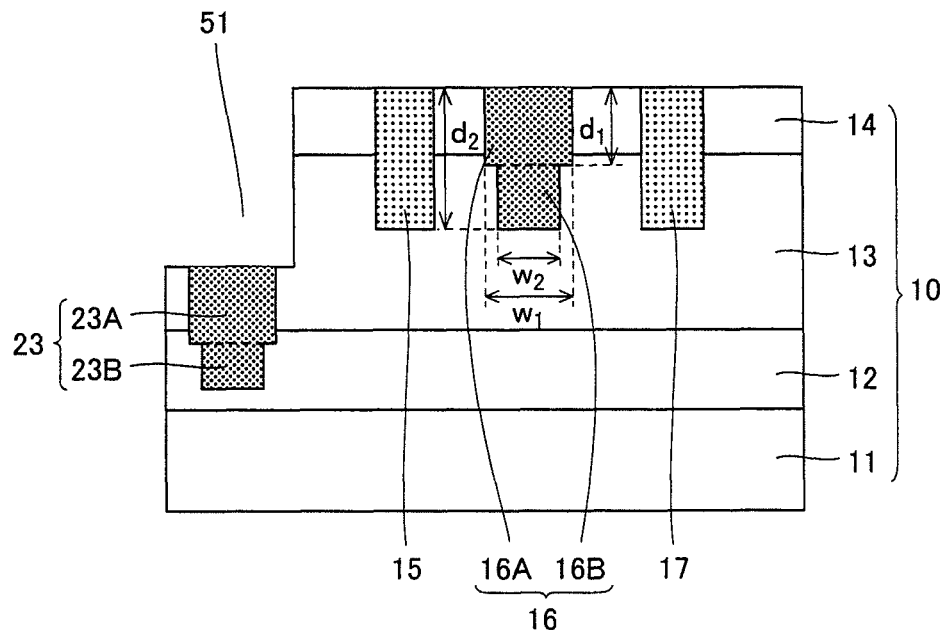
FIG. 11 is a schematic cross sectional view for illustrating the method for manufacturing the JFET.

Then, referring to FIG. 2, the activation annealing step is carried out as a step (S100). In this step (S100), referring to FIG. 11, Ti layer 81 and W layer 82 are first removed. Then, wafer 10 is heated to approximately 1700° C., for example, in the inert gas atmosphere such as argon and maintained for about 30 minutes for activation annealing. Accordingly, impurities such as P and Al introduced in the steps (S60), (S80) and (S90) are activated, so that these impurities can function as n-type impurities or p-type impurities. Consequently, first n-type region 15 and second n-type region 17 each serving as an n-type impurity region are formed, and first p-type region 16 and second p-type region 23 each serving as a p-type impurity region are formed which include base regions 16A and 23A, and protruding regions 16B and 23B, respectively.

Figure 12:
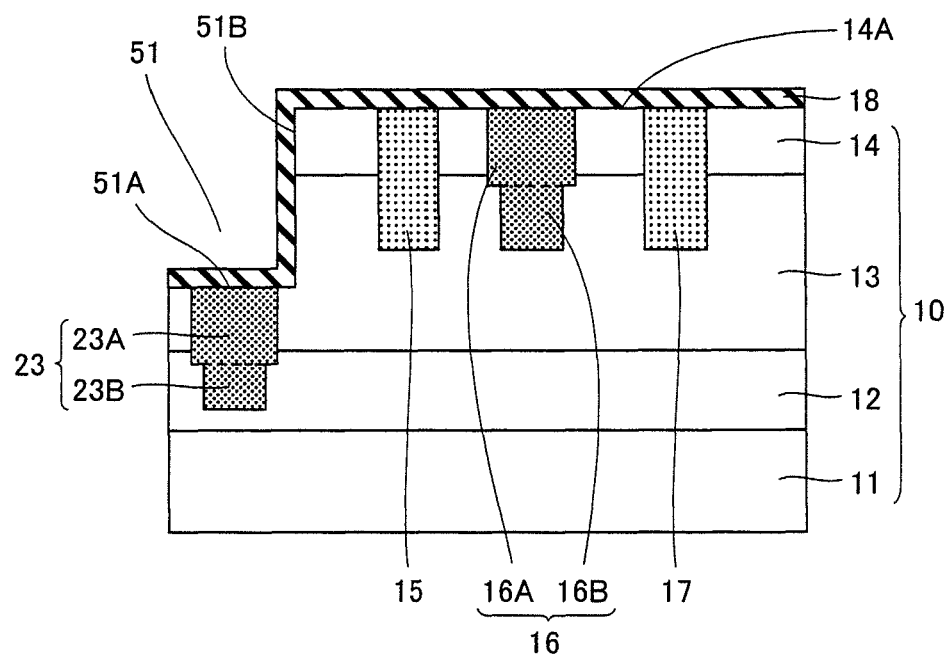
FIG. 12 is a schematic cross sectional view for illustrating the method for manufacturing the JFET.

Then, referring to FIG. 2, the oxide film formation step is carried out as a step (S110). Specifically, in the step (S110), referring to FIG. 12, a thermal oxidation process is carried out in which wafer 10 is heated to approximately 1300° C., for example, in the oxygen atmosphere and maintained for about 30 minutes, which leads to formation of oxide film 18 (field oxide film) as an insulation film covering upper surface 14A of second p-type layer 14, and bottom wall 51A and side wall 51B of groove 51. Oxide film 18 has a thickness, for example, of approximately 0.1 μm.

Figure 13:
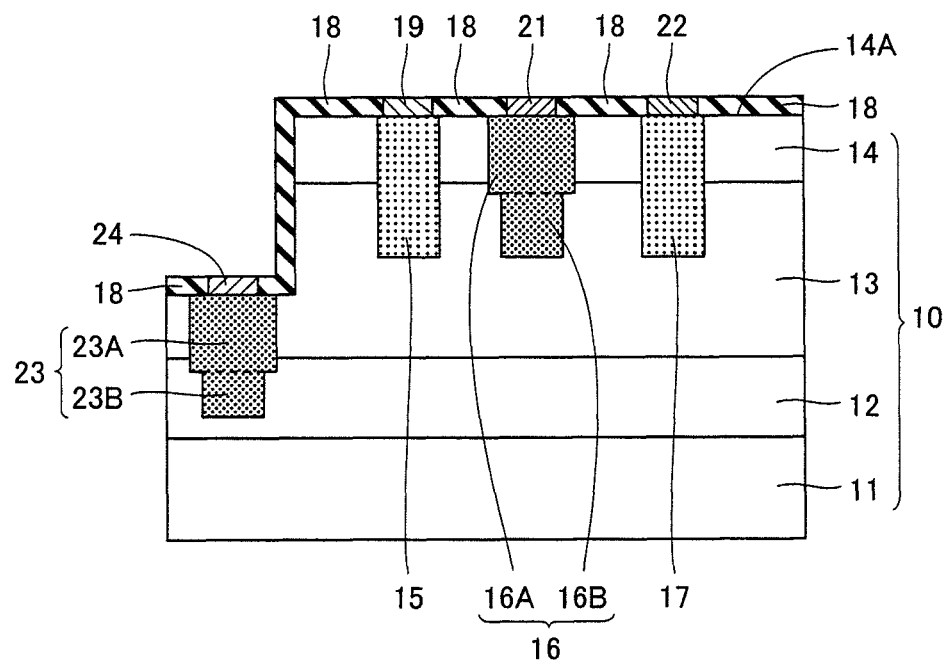
FIG. 13 is a schematic cross sectional view for illustrating the method for manufacturing the JFET.

Then, referring to FIG. 2, the ohmic electrode formation step is carried out as a step (S120). In this step (S120), referring to FIG. 13, after a resist is first applied onto oxide film 18, exposure and development are performed to form a resist film having an opening corresponding to each region where source contact electrode 19, gate contact electrode 21, drain contact electrode 22, and potential holding contact electrode 24 are to be formed (see FIG. 1). The resist film is then used as a mask to partially remove oxide film 18, for example, by RIE. Then, Ni having a thickness, for example, of approximately 500 Å is formed, for example, by sputtering. Furthermore, when the resist film is removed, the Ni film on the resist film is removed (lifted off) to thereby form source contact electrode 19, gate contact electrode 21, drain contact electrode 22, and potential holding contact electrode 24 each made of Ni so as to be located on and in contact with first n-type region 15, first p-type region 16, second n-type region 17, and second p-type region 23, respectively. In this case, gate contact electrode 21 can be configured to have an electrode width of 2 μm or less. Furthermore, the alloying process is carried out in which wafer 10 is heated, for example, to approximately 1000° C. in the inert gas atmosphere such as Ar. Consequently, source contact electrode 19, gate contact electrode 21, drain contact electrode 22, and potential holding contact electrode 24 each made of Ni are silicidized.

Then, referring to FIG. 2, the wiring formation step is carried out as a step (S130). In this step (S130), referring to FIG. 1, source wiring 25, gate wiring 26 and drain wiring 27 are formed in contact with the upper surface of each of source contact electrode 19, gate contact electrode 21 and drain contact electrode 22, respectively. Source wiring 25, gate wiring 26 and drain wiring 27 can be formed, for example, by forming a resist layer having an opening in each of the desired regions where source wiring 25, gate wiring 26 and drain wiring 27 are to be formed, and then, vapor-depositing Al to remove (lift off) the Al on the resist layer together with the resist layer.

Then, referring to FIG. 2, the passivation film formation step is carried out as a step (S140). In this step (S140), referring to FIG. 1, passivation film 44 made, for example, of SiO$_2$ is formed so as to cover the upper surface of each of source electrode 41, gate electrode 42, drain electrode 43, and oxide film 18. This passivation film 44 can be formed, for example, by a CVD (chemical vapor deposition) method.

The above-described steps are carried out to complete JFET 1 in the present embodiment. Thus, according to the method for manufacturing a semiconductor device in the present embodiment, JFET 1 in the present embodiment can readily be manufactured.

Although the JFET has been described in the above-described embodiments as an example of the semiconductor device of the present invention, the semiconductor device of the present invention and the method for manufacturing the same are not limited thereto, but may also be applied to another semiconductor device such as an MOSFET and a pn diode, for example, having a high-concentration ion implantation layer and an ohmic electrode on the high-concentration ion implantation layer, and another method for manufacturing the semiconductor device.

It should be understood that the embodiments disclosed herein are illustrative and non-restrictive in every respect. The scope of the present invention is defined by the terms of the claims, rather than the description above, and is intended to include any modifications within the scope and meaning equivalent to the terms of the claims.

INDUSTRIAL APPLICABILITY

The semiconductor device according to the present invention and the method for manufacturing the same may be particularly advantageously applied to a semiconductor device including a wafer having at least one main surface made of silicon carbide and a method for manufacturing the semiconductor device.

DESCRIPTION OF THE REFERENCE SIGNS

1 JFET, 10 wafer, 11 n-type substrate, 12 first p-type layer, 13 n-type layer, 14 second p-type layer, 14A upper surface, 15 first n-type region, 16 first p-type region, 16A base region, 16B protruding region, 16C first region, 16D second region, 17 second n-type region, 18 oxide film, 19 source contact electrode, 21 gate contact electrode, 21A diffusion region, 22 drain contact electrode, 23 second p-type region, 23A base region, 23B protruding region, 23C first region, 23D second region, 24 potential holding contact electrode, 25 source wiring, 26 gate wiring, 27 drain wiring, 41 source electrode, 42 gate electrode, 43 drain electrode, 44 passivation film, 51 groove, 51A bottom wall, 51B side wall, 81 Ti layer, 82 W layer, 83, 84, 85 and 86 opening, 89 SiO$_2$ layer.

The invention claimed is:

1. A semiconductor device comprising:
  a wafer having at least one main surface made of silicon carbide; and
  an electrode formed on said one main surface,
  said wafer including an ion implantation region formed to include said one main surface,
  said ion implantation region including
  a base region disposed to include said one main surface, and
  a protruding region connected to said base region and extending in a direction opposite to said electrode,
  said base region being greater in width in a direction along said one main surface than said protruding region,
  said electrode being disposed in contact with said ion implantation region such that said electrode is entirely located on said ion implantation region as seen in plan view, said electrode being a gate electrode,
  said wafer including
  a first layer of a first conductivity type,
  a layer of a second conductivity type which is different in conductivity type from said first layer of the first conductivity type, and disposed on and in contact with said first layer of the first conductivity type,
  a second layer of the first conductivity type which is identical in conductivity type to said first layer of the first conductivity type, and disposed on and in contact with said layer of the second conductivity type, and
  said ion implantation region touching said layer of the second conductivity type, wherein said protruding region of said ion implantation region is embedded in said layer of the second conductivity type, and said protruding region is spaced apart from said first layer of the first conductivity type.

2. The semiconductor device according to claim 1, wherein a thickness of said base region in a direction of a thickness of said wafer is less than or equal to a distance from said one main surface to an interface between said second layer of the first conductivity type and said layer of the second conductivity type.

3. The semiconductor device according to claim 1, wherein said base region is greater in width in the direction along said one main surface than said protruding region by 0.2 μm or more and 1.0 μm or less.

4. The semiconductor device according to claim 1, wherein said base region has a thickness of 0.3 μm or more.

5. The semiconductor device according to claim 1, wherein said wafer includes a second ion implantation region, and said second ion implantation region extends to said first layer of the first conductivity type.

* * * * *